United States Patent
Ali et al.

(10) Patent No.: US 7,065,113 B2
(45) Date of Patent: Jun. 20, 2006

(54) METHOD AND APPARATUS FOR INTERCONNECTING A LASER ARRAY AND AN INTEGRATED CIRCUIT OF A LASER-BASED TRANSMITTER

(76) Inventors: Mohammed Ershad Ali, 955 Escalon Ave., No. 305, Sunnyvale, CA (US) 94085; Edwin De Groot, 12730 Camrose Ave., Saratoga, CA (US) 95070; Brian Elliot Lemoff, 4844 Tammy Ct., Union City, CA (US) 94587; Lisa Anne Buckman, 108 Esplanade Ave., No. 174, Pacifica, CA (US) 94044

( * ) Notice: Subject to any disclaimer, the term of this patent is extended or adjusted under 35 U.S.C. 154(b) by 114 days.

(21) Appl. No.: 10/136,928

(22) Filed: Apr. 30, 2002

(65) Prior Publication Data

US 2003/0202549 A1 Oct. 30, 2003

(51) Int. Cl.
*H01S 3/04* (2006.01)
*H01S 3/00* (2006.01)
*H01S 5/00* (2006.01)

(52) U.S. Cl. .............................. 372/36; 372/43; 372/44
(58) Field of Classification Search ............... 372/38.2, 372/36, 43–44, 38, 96; 257/100, 200, 707, 257/686, 777, 98; 250/239, 216; 438/106, 438/57, 60, 64; 385/14, 39, 92
See application file for complete search history.

(56) References Cited

U.S. PATENT DOCUMENTS 4,359,773 A 11/1982 Swartz et al.
5,475,263 A * 12/1995 Coady et al. ................ 257/700
5,541,524 A * 7/1996 Tuckerman et al. ......... 327/754
5,578,525 A * 11/1996 Mizukoshi .................... 29/840
5,583,376 A 12/1996 Sickler et al.
5,708,280 A * 1/1998 Lebby et al. .................. 257/88
5,790,728 A * 8/1998 Wentworth ................... 385/39
5,821,571 A * 10/1998 Lebby et al. .................. 257/98
6,222,868 B1 * 4/2001 Ouchi et al. ................... 372/50
6,243,508 B1 * 6/2001 Jewell et al. .................. 385/14
6,342,406 B1 * 1/2002 Glenn et al. ................... 438/57
6,388,798 B1 * 5/2002 Smith et al. .................. 359/290
6,406,934 B1 * 6/2002 Glenn et al. ................. 438/106
6,477,286 B1 * 11/2002 Ouchi .......................... 385/14
6,483,037 B1 * 11/2002 Moore et al. ............... 174/254
6,597,718 B1 * 7/2003 Tanbun-Ek et al. ........... 372/50
6,635,866 B1 * 10/2003 Chan et al. .................. 250/239
6,639,714 B1 * 10/2003 Smith et al. ................. 359/321
6,642,485 B1 * 11/2003 Goenka et al. .............. 219/400
6,647,050 B1 * 11/2003 Yuen et al. .................... 372/96
6,686,588 B1 * 2/2004 Webster et al. ............. 250/239
6,734,552 B1 * 5/2004 Combs et al. ............... 257/707
6,818,977 B1 * 11/2004 Poo et al. .................... 257/685
6,849,916 B1 * 2/2005 Glenn et al. ................. 257/434
6,864,509 B1 * 3/2005 Worley ......................... 257/80
6,910,812 B1 * 6/2005 Pommer et al. .............. 385/92

(Continued)

FOREIGN PATENT DOCUMENTS

EP 0 636 908 A1 7/1994

(Continued)

*Primary Examiner*—Wilson Lee
*Assistant Examiner*—Hung Tran Vy

(57) ABSTRACT

A driver IC and EML array are electrically coupled to one another via a flexible PCB. Thermal isolation between the driver IC and EML array is adjusted by varying a cross-section and length of electrically-conductive traces on the PCB.

20 Claims, 2 Drawing Sheets

U.S. PATENT DOCUMENTS

| | | | |
|---|---|---|---|
| 2003/0042595 A1* | 3/2003 | Canella | 257/690 |
| 2003/0147580 A1* | 8/2003 | Worley | 385/14 |
| 2003/0201462 A1* | 10/2003 | Pommer et al. | 257/200 |
| 2004/0163836 A1* | 8/2004 | Kumar et al. | 174/50 |

FOREIGN PATENT DOCUMENTS

| | | |
|---|---|---|
| EP | 0 981 214 A2 | 8/1999 |

\* cited by examiner

METHOD AND APPARATUS FOR INTERCONNECTING A LASER ARRAY AND AN INTEGRATED CIRCUIT OF A LASER-BASED TRANSMITTER

BACKGROUND OF THE INVENTION

1. Technical Field of the Invention

Embodiments in accordance with the invention relate generally to laser-based transmitters, and more specifically to interconnecting electroabsorption modulated lasers (EML) with a driver integrated circuit (IC).

2. Description of Related Art

Electroabsorption modulated laser (EML) based Coarse Wavelength Division Multiplexed (CWDM) transmitters achieve data rates of 10 Gb/s and greater per channel. An EML typically includes a monolithically-integrated continuous-wave distributed feedback (DFB) laser and an electroabsorption modulator. A typical EML CWDM transmitter module includes: (1) an array of EMLs, with each EML operating at a different wavelength; (2) a multi-channel driver integrated circuit (IC) to drive the array of EMLs at a desired data rate; (3) an optical multiplexer to combine the array's optical outputs; (4) and focusing optics to couple multiplexer outputs to an optical fiber.

It is desirable that the EML CWDM transmitter module achieve as great a maximum data rate as possible. However, electrical interconnections between a multi-channel driver IC and an EML array limit the maximum achievable data rate of the EML CWDM transmitter module. The maximum data rate is often lower than desirable due to high-speed electrical signal induced inductance. The inductance can be reduced by shortening the interconnections between the IC and the EML array.

In a typical arrangement, making the interconnections between the IC and the EML array sufficiently short is difficult. The optical multiplexer is placed near a front of an EML array facet where light emerges from the EML array. The driver IC is typically placed adjacent to a back facet of the EML array. In this arrangement, a high-speed portion of the EML array is near the front facet. Since the high-speed portion of the EML array is near the front facet, an interconnection from the back of the EML array to the driver IC is considered lengthy. Such an arrangement is not preferable for high-data-rate applications.

Thermal management issued are introduced when the interconnection length is shortened. Data rate can be maximized between an EML and a driver IC by directly flip-chip bonding the EML array onto the driver IC. Although a sufficiently-short interconnection length is achieved by directly flip-chip bonding the EML array onto the driver IC, thermal management of the combination becomes difficult because a driver-IC-EML-array assembly so flip-chip bonded must be cooled down to within the EML array's operating temperature.

Conflicting requirements of low interconnection-induced inductances and high thermal resistance make the high-speed interconnection between an EML array and a driver IC difficult. What is needed is an interconnection between a driver IC and the EML array resulting in low interconnection-induced inductances, high thermal resistance, and low space consumption.

SUMMARY OF THE INVENTION

A typical embodiment in accordance with the invention provides a method of producing a laser-based device. The laser-based device includes a thermally-insulative substrate. The thermally-insulative substrate includes two sides. One side has an electrical conductor associated with it. The second side has an electrical conductor associated with it. The substrate incorporates an electrically-conductive via between the two sides. The electrically-conductive via electrically couples the electrical conductors. An integrated circuit and a laser can be electrically coupled to the electrical conductors.

Another typical embodiment in accordance with the invention provides a laser-based apparatus. The laser-based apparatus includes a laser, an integrated circuit to drive the laser, and a thermally-insulative substrate sandwiched between the laser and the integrated circuit.

Furthermore, the invention provides embodiments with other features and advantages in addition to or in lieu of those discussed above. Many of these features and advantages are apparent from the description below with reference to the following drawings.

BRIEF DESCRIPTION OF THE DRAWINGS

The disclosed invention will be described with reference to the accompanying drawings, which shows important sample embodiment of the invention and which is incorporated in the specification hereof by reference, wherein.

DETAILED DESCRIPTION OF THE EXEMPLARY EMBODIMENTS IN ACCORDANCE WITH THE INVENTION

In the following Detailed Description of the Exemplary Embodiments in Accordance with the Invention, for purposes of explanation and not limitation, specific details are set forth in order to provide a thorough understanding of typical embodiments in accordance with the invention. However, it will be apparent to those of ordinary skill in the art that embodiments in accordance with the invention can be practiced in other embodiments that depart from these specific details. In other instances, detailed descriptions of well-known methods, devices, and the like are omitted so as not to obscure description of the embodiments in accordance with the invention with unnecessary detail. In particular, aspects of EMLs are referenced in order to help describe specific aspects of typical embodiments in accordance with the invention.

Embodiments in accordance with the invention yield a practical way of interconnecting the driver IC and the EML array that provides a sufficiently-short interconnection length as well as a high level of thermal isolation and low space consumption. The driver IC can be operated at a higher temperature than the EML array; therefore, a TEC adapted to cool the EML array and not the driver IC can be used. A well-designed heat sink suffices in most embodiments for cooling of the driver IC.

Embodiments in accordance with the invention use integration of the EML array and the driver IC with an intervening thermally-insulative substrate. In a typical embodiment, the intervening thermally-insulative substrate is a double-sided flexible printed circuit board (PCB). The flexible PCB can include, for example, Kapton® tape, its equivalent, or a derivation thereof. The EML array and the driver IC are in many configurations flip-chip bonded on opposite sides of the flexible PCB, either directly opposite one another or transversely offset relative to one another (i.e., the driver IC and the EML array are arranged so that they are not directly opposite one another on either side of the substrate). Transversely offsetting of the driver IC and the EML array can further optimize both electrical and thermal performance of the assembly.

Figure 1:
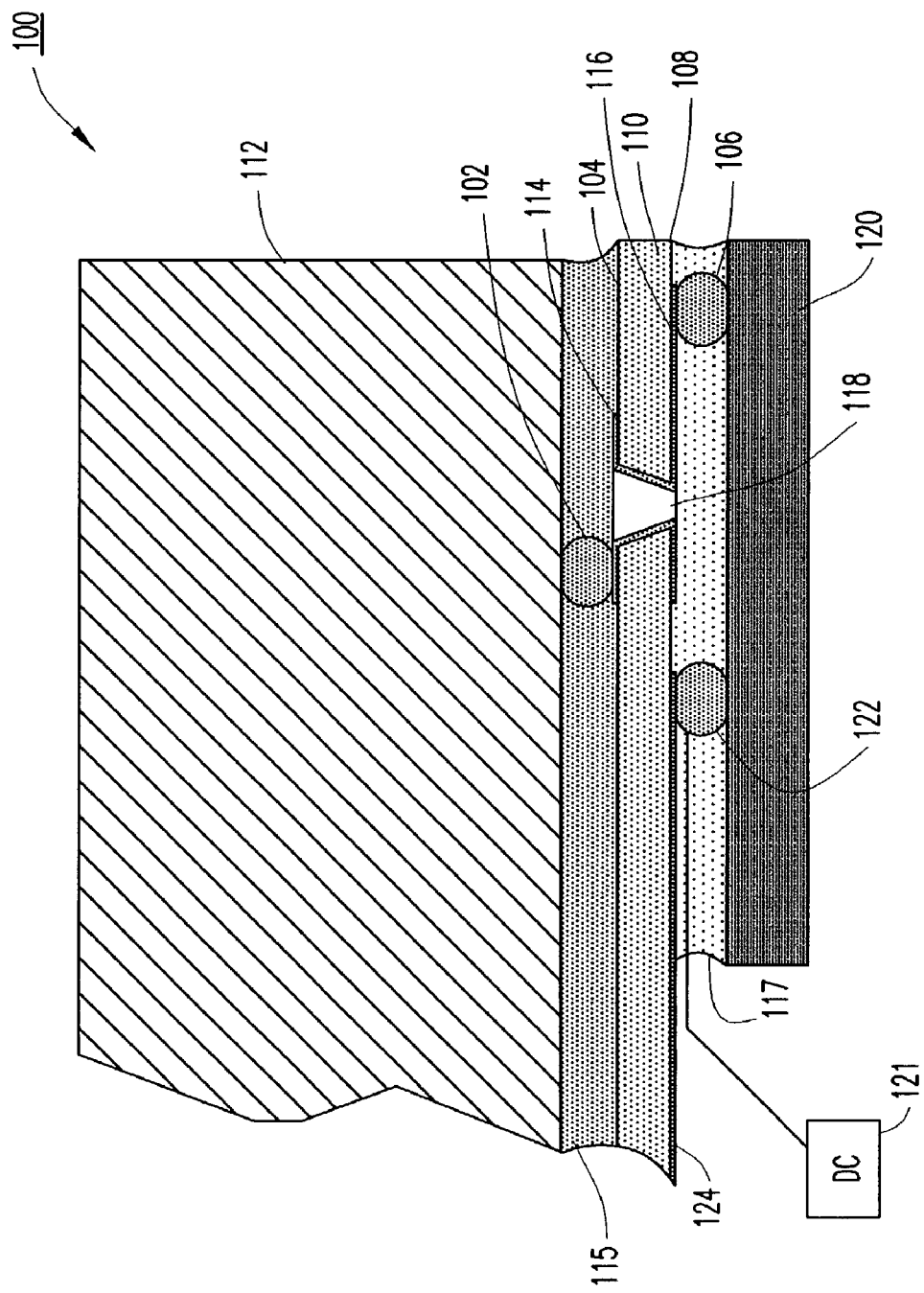
FIG. 1 is a cross-sectional diagram of a driver-IC-EML-array assembly.

FIG. 1 illustrates driver-IC-EML-array assembly 100 in accordance with teachings of the invention. Bond pad 102 is present on first side 104 and raised bond pad 106 is present on second side 108 of thermally-insulative substrate 110, shown as in FIG. 1 as a flexible PCB. Raised bond pad 106 can be fabricated via a known bumping process in which a conductive bump is grown on top of a bond pad. Although thermally-insulative substrate 110 does not necessarily have to be flexible, in a typical embodiment substrate 110 is flexible in order to better withstand thermal stresses.

Driver IC 112 is electrically connected to bond pad 102 of flexible PCB 110. At least one first electrically-conductive trace 114 electrically connected to bond pad 102 is present on first side 104 and at least one second electrically conductive trace 116 electrically connected to raised bond pad 106 is present on second side 108 of flexible PCB 110.

Electrically-conductive via 118 between the trace 114 of first side 104 and trace 116 of second side 108 is used to make a high-speed electrical interconnection between EML array 120 and driver IC 112. Under-fill layers 115 and 117 shown adjacent driver IC 112 and the EML array, respectively, provide a mechanical connection and improve thermal-stress performance. Bond pad 102, traces 114 and 116, and raised bond pad 106 form the electrical interconnection between EML array 120 and driver IC 112. Various combinations of traces, bond pads, or vias can be used as dictated by design criteria.

Flexible PCB 110 can serve as a thermal insulator. Flexible PCB 110, being a poor conductor of heat, acts as a thermal insulator between the EML array 120 and driver IC 112. Heat from driver IC 112 is conducted to EML array 120 predominantly through the electrical interconnection between EML array 120 and driver IC 112. A thermal resistance of the electrical interconnection depends on a length and cross-section of various components of the electrical interconnection. Traces 114 and 116 on flexible PCB 110 can be made to have a relatively small cross-section, which significantly decreases the amount of heat transmitted from driver IC 112 to EML array 120 due to the electrical interconnection therebetween and has little effect on interconnection-induced inductance.

As noted above, the length of the electrical interconnection between driver IC 112 and EML array 120 impacts electrical performance and heat transmission. The length of the electrical interconnection between driver IC 112 and EML array 120 can be extended to an electrical performance limit of EML array 120 in order to decrease the heat transmission from driver IC 112 to EML array 120 as much as possible without degrading the performance of EML array 120 too much. Adjusting the cross-section and the length of the electrical interconnection typically permits an order of magnitude improvement in thermal isolation between driver IC 112 and EML array 120 to be realized relative to when EML array 120 is directly flip-chip bonded onto driver IC 112.

A DC connection is routed on second side 108 of flexible PCB 110, which reduces the complexity of the design of driver IC 112 and serves to further increase the thermal isolation of driver IC 112 from EML array 120. The DC connection to DC power source 121 made through, for example, raised bond pad 122 connected to trace 116 and to a DFB laser (not specifically shown) of EML array 120 does not need to pass through driver IC 112. Raised bond pad 122, like raised bond pad 106, can be fabricated via a known bumping process in which a conductive bump is grown on top of a bond pad. Electrically conductive trace 124 is shown electrically connected to raised bond pad 122 on second side 108.

Figure 2:
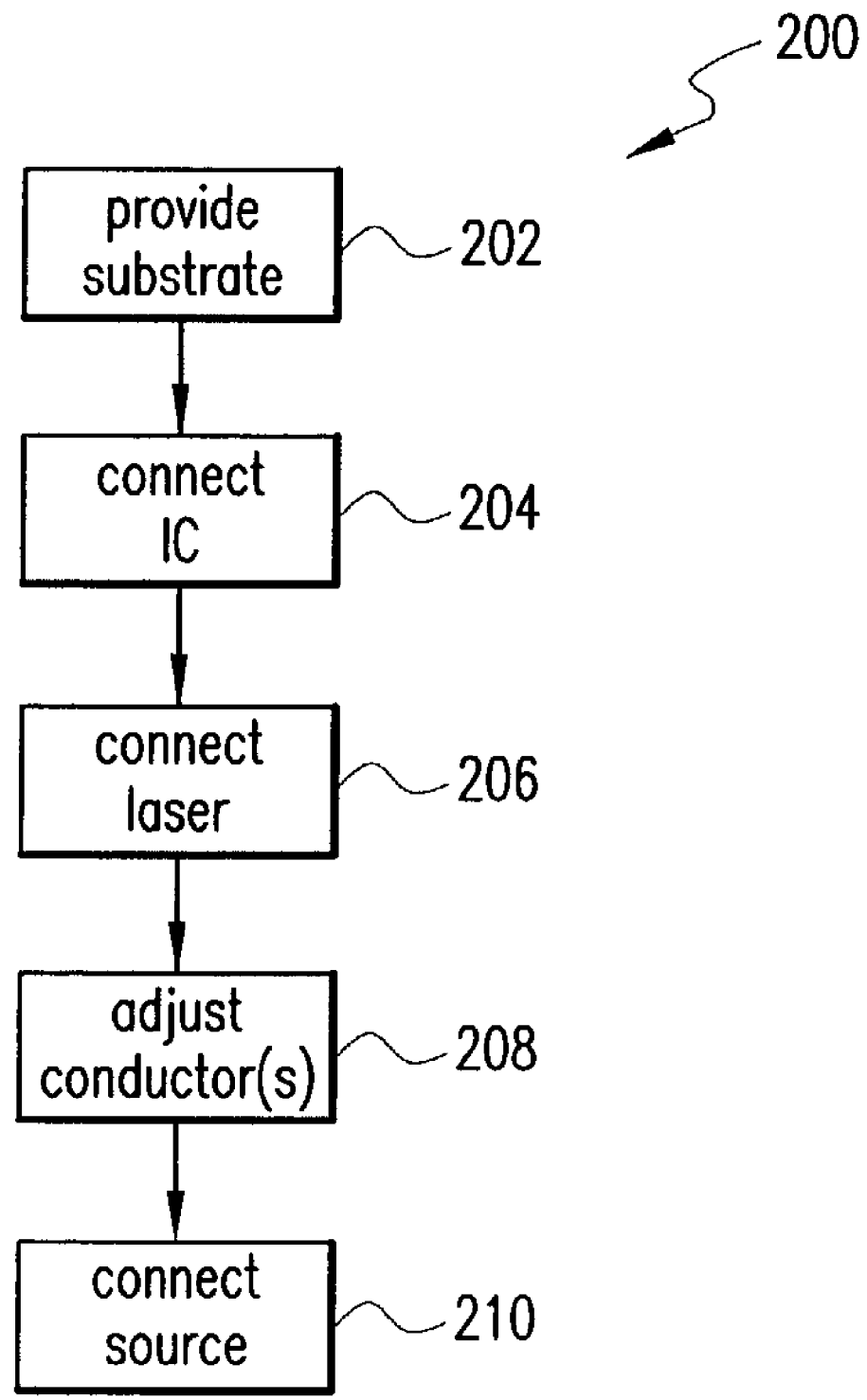
FIG. 2 is a flow chart that illustrates a method of producing a laser-based device.

FIG. 2 is a flow chart that illustrates a method of producing a laser-based device in accordance with teachings of the invention. Flow 200 begins at step 202, at which step a thermally-insulative substrate is provided. The thermally-insulative substrate, which can be, for example, a flexible, semi-flexible, or rigid PCB, includes a first side. The first side has at least one electrical conductor associated with the first side. The thermally-insulative substrate also includes a second side. The second side has at least one electrical conductor associated with the second side. At least one electrically-conductive via passes between the first side and the second side. The electrically-conductive via serves to electrically connect the electrical conductors on the first and second sides with one another.

At step 204, an integrated circuit is connected to the electrical conductor(s) associated with the first side. At step 206, at least one laser is connected to the electrical conductor(s) associated with the second side. At step 208, the cross-section and the length of one or more of the electrical conductors is adjusted. At step 210, an electrical power source is connected by another electrical conductor associated with the second side to the laser(s). Although the steps shown in the flow 200 are arranged in a particular order, the steps need not necessarily be performed in the order listed.

Currently-available flexible PCB technology permits a layout of electrically-conductive traces on both sides of a thermally-insulative substrate having a thickness of less than 50 microns. Plated or filled via with diameters of less than 50 microns are also achievable. High-speed electrical interconnections in accordance with embodiments of the invention can be practically implemented in a manufacturing environment. With properly-designed tools and fixtures, commercially available flip-chip bonders can be used.

The above illustrates how an exemplary laser-based transmitter module can be produced in accordance with principles of embodiments in accordance with the invention. Embodiments in accordance with the invention permit laser-based transmitter modules to include electrical interconnections between a driver IC and a laser array without unnecessarily great interconnection-induced inductances that would otherwise impair the data rate achievable by the laser-based transmitter. In addition, embodiments in accordance with the invention permit the driver IC and the laser array to be effectively thermally isolated from one another so that the driver IC does not need to be unnecessarily cooled to a suitable operating temperature of the laser array.

Further, embodiments in accordance with the invention permit electrical connections to parts of the laser array to be connected to power without having to pass through the driver IC, thereby reducing complexity of the driver IC design. Moreover, the length and cross-section of the electrical interconnections between the driver IC and the laser array can be adjusted so as to optimally set a tradeoff between thermal isolation between the driver IC and the laser array and electrical-interconnection-induced inductance.

As will be recognized by those having skill in the art, the innovative concepts described in this patent application can be modified and varied over a wide range of applications. The scope of patented subject matter should accordingly not be limited to any of the specific exemplary teachings discussed herein, but is instead defined by the following claims.

We claim:

1. A method for producing a laser-based device, the method comprising:
    providing a thermally-insulative substrate, the thermally-insulative substrate comprising:
        a first side having at least one first electrical conductor associated therewith;

a second side having at least one second electrical conductor associated therewith, each of said first electrical conductor and said second electrical conductor including a respective electrically-conductive trace; and at least one electrically-conductive via passing between the first side and the second side, the electrically-conductive via electrically coupling the first electrical conductor with the second electrical conductor;

electrically coupling an integrated circuit to the at least one first electrical conductor;

electrically coupling at least one laser to the at least one second electrical conductor;

arranging the integrated circuit and the at least one laser directly opposite one another relative to the thermally-insulative substrate;

providing a respective under-fill layer between said thermally-insulative substrate and said integrated circuit and said thermally-insulative substrate and said at least one laser; and electrically coupling the integrated circuit and the laser to the respective electrically-conductive trace through the respective under-fill layer.

2. The method of claim 1, further comprising adjusting at least one of a cross-section and a length of the first electrical conductor and the second electrical conductor.

3. The method of claim 1, further comprising coupling an electrical power source to the at least one laser by a third electrical conductor associated with the second side.

4. The method of claim 1, wherein the at least one first electrical conductor comprises a bond pad electrically coupling the integrated circuit to the electrically-conductive trace through the under-fill layer.

5. The method of claim 1, wherein at least one second electrical conductor comprises a bond pad electrically coupling the at least one laser to the electrically-conductive trace through the under-fill layer.

6. The method of claim 1, wherein at least one laser comprises an electroabsorption modulated laser.

7. The method of claim 1, wherein the thermally-insulative substrate comprises a flexible printed circuit board.

8. A laser-based apparatus comprising:
a first laser;
an integrated circuit adapted to drive the first laser;
a thermally-insulative substrate sandwiched between the first laser and the integrated circuit with the first laser and the integrated circuit arranged directly opposite one another relative to the thermally-insulative substrate the thermally-insulative substrate comprising:
a first side having a first electrical conductor associated therewith and electrically coupled to the first laser;
a second side having a second electrical conductor associated therewith and electrically coupled to the integrated circuit, each of said first electrical conductor and said second electrical conductor including a respective electrically-conductive trace; and
an electrically-conductive via passing between the first side and the second side, the electrically-conductive via being electrically coupled to the first electrical conductor and to the second electrical conductor; and
a respective under-fill layer between said thermally-insulative substrate and said integrated circuit and said thermally-insulative substrate and said first laser;
wherein said first electrical conductor and said second electrical conductor each further includes a respective bond pad for electrically coupling said integrated circuit and said first laser to said respective electrically-conductive trace through said respective under-fill layer.

9. The apparatus of claim 8, wherein the first laser comprises an electroabsorption modulated laser.

10. The apparatus of claim 8, wherein the thermally-insulative substrate comprises a flexible printed circuit board.

11. The apparatus of claim 8, further comprising an electrical power source coupled to the laser by a third electrical conductor associated with the first side.

12. The apparatus of claim 8, further comprising a second laser electrically coupled to the first electrical conductor.

13. The apparatus of claim 8, wherein at least one of the first laser and the integrated circuit is flip-chip bonded to the thermally-insulative substrate.

14. The apparatus of claim 8, wherein the apparatus is adapted to yield data rates of at least 10 Gb/s.

15. The method of claim 1, wherein said respective under-fill layers improve thermal-stress performance of the at least one laser and the integrated circuit.

16. The apparatus of claim 8, wherein said respective under-fill layers improve thermal-stress performance of the at least one laser and the integrated circuit.

17. A method for producing a laser-based device, the method comprising:
providing a thermally-insulative substrate, the thermally-insulative substrate comprising:
a first side having at least one first electrical conductor associated therewith;
a second side having at least one second electrical conductor associated therewith, each of said first electrical conductor and said second electrical conductor including a respective electrically-conductive trace; and
at least one electrically-conductive via passing between the first side and the second side, the electrically-conductive via electrically coupling the first electrical conductor with the second electrical conductor;
electrically coupling an integrated circuit to the at least one first electrical conductor;
electrically coupling at least one laser to the at least one second electrical conductor;
providing a respective under-fill layer between said thermally-insulative substrate and said integrated circuit and said thermally-insulative substrate and said at least one laser, including providing one of the under-fill layers in contact against both the thermally-insulative substrate and the integrated circuit; and
electrically coupling the integrated circuit and the at least one laser to the respective electrically-conductive trace through the respective under-fill layer.

18. The method of claim 17, further comprising arranging the integrated circuit and the at least one laser directly opposite one another relative to the thermally-insulative substrate.

19. The method of claim 17, further comprising providing another of the under-fill layers in contact against both the thermally-insulative substrate and the at least one laser.

20. The method of claim 19, further comprising arranging the integrated circuit and the at least one laser directly opposite one another relative to the thermally-insulative substrate.

* * * * *

UNITED STATES PATENT AND TRADEMARK OFFICE
CERTIFICATE OF CORRECTION

PATENT NO. : 7,065,113 B2  Page 1 of 1
APPLICATION NO. : 10/136928
DATED : June 20, 2006
INVENTOR(S) : Mohammad Ershad Ali It is certified that error appears in the above-identified patent and that said Letters Patent is hereby corrected as shown below:

Title Page, Col. 1, (Inventors), Line 7-9, delete "108 Esplanade Ave., No. 174, Pacifica, CA (US) 94044" and insert -- 3757 Webster St. #105 San Francisco, CA (US) 94123 --;

Title Page, Col. 2, (U.S. Patent Documents), Line 2, delete "327/754" and insert -- 324/754 --;

Column 5, Line 48, Claim 8, after "substrate" insert -- , --.

Signed and Sealed this

Fifteenth Day of June, 2010

David J. Kappos
*Director of the United States Patent and Trademark Office*